(12) United States Patent
Son et al.

(10) Patent No.: US 11,114,619 B2
(45) Date of Patent: Sep. 7, 2021

(54) CONJUGATED POLYMER FOR A PHOTOACTIVE LAYER, A COATING COMPOSITION INCLUDING THE CONJUGATED POLYMER, AND AN ORGANIC SOLAR CELL INCLUDING THE PHOTOACTIVE LAYER

(71) Applicant: KOREA INSTITUTE OF SCIENCE AND TECHNOLOGY, Seoul (KR)

(72) Inventors: Hae Jung Son, Seoul (KR); Sungmin Park, Seoul (KR); Jong Baek Park, Seoul (KR); Sohyun Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/543,896

(22) Filed: Aug. 19, 2019

(65) Prior Publication Data

US 2020/0274069 A1    Aug. 27, 2020

(30) Foreign Application Priority Data

Feb. 21, 2019    (KR) ........................ 10-2019-0020421

(51) Int. Cl.
    *C08G 61/12*      (2006.01)
    *H01L 51/00*      (2006.01)
    *H01B 1/20*      (2006.01)
    *H01B 1/12*      (2006.01)
    *H01L 51/42*      (2006.01)

(52) U.S. Cl.
CPC ........ *H01L 51/0036* (2013.01); *C08G 61/126* (2013.01); *H01B 1/127* (2013.01); *H01B 1/20* (2013.01); *H01L 51/0043* (2013.01); *H01L 51/0046* (2013.01); *H01L 51/0047* (2013.01); *C08G 2261/124* (2013.01); *C08G 2261/149* (2013.01); *C08G 2261/1412* (2013.01); *C08G 2261/18* (2013.01); *C08G 2261/228* (2013.01); *C08G 2261/3223* (2013.01); *C08G 2261/3243* (2013.01); *C08G 2261/3246* (2013.01); *C08G 2261/91* (2013.01); *H01L 51/42* (2013.01)

(58) Field of Classification Search
CPC .......... H01B 1/12; H01B 1/124; H01B 1/127; H01B 1/20; C08G 61/126; C08G 2261/124; C08G 2261/1412; C08G 2261/146; C08G 2261/149; C08G 2261/18; C08G 2261/228; C08G 2261/3223; C08G 2261/3243; C08G 2261/3246; C08G 2261/64; C08G 2261/91; H01L 51/0036; H01L 51/0043; H01L 51/0046; H01L 51/0047
See application file for complete search history.

(56) References Cited

U.S. PATENT DOCUMENTS

| | | | |
|---|---|---|---|
| 9,908,857 B2* | 3/2018 | Pan ...................... | C07D 495/04 |
| 10,787,538 B2* | 9/2020 | Bullock .............. | H01L 51/4253 |
| 2014/0166942 A1* | 6/2014 | Izawa .................... | C08K 3/045 |
| | | | 252/511 |
| 2018/0026193 A1* | 1/2018 | Pan ...................... | C08G 61/126 |
| | | | 528/9 |
| 2019/0013474 A1* | 1/2019 | Yan ...................... | H01L 51/0036 |
| 2019/0233578 A1* | 8/2019 | Bullock .............. | H01L 51/4253 |

FOREIGN PATENT DOCUMENTS

| | | | | |
|---|---|---|---|---|
| KR | 10-1387065 B1 | 4/2014 | | |
| WO | WO-2012087243 A1 * | 6/2012 | ........... | C08G 61/123 |
| WO | WO-2016078744 A1 * | 5/2016 | ......... | H01L 51/0036 |

\* cited by examiner

*Primary Examiner* — Matthew R Diaz

(74) *Attorney, Agent, or Firm* — Rabin & Berdo, P.C.

(57) ABSTRACT

A conjugated polymer that is an electron donor, that is soluble without aggregation, that is solution-coatable and is dryable at a temperature below 70° C., that has an energy conversion efficiency of 7 % or more over an area of 5 cm$^2$ or more, and that is composed of a repeating unit represented by Chemical Formula 1A below:

Chemical Formula 1A where x is a real number from 0.1 to 0.2; and n is an integer from 1 to 1,000. The conjugated polymer forms a uniform thin film over a large area of, for example, an organic solar cell, without a heat treatment due to superior solubility and crystallinity at low temperature and, thus, allows fabrication of an organic solar cell with high efficiency at a low temperature.

10 Claims, 3 Drawing Sheets

CONJUGATED POLYMER FOR A PHOTOACTIVE LAYER, A COATING COMPOSITION INCLUDING THE CONJUGATED POLYMER, AND AN ORGANIC SOLAR CELL INCLUDING THE PHOTOACTIVE LAYER

CROSS-REFERENCE TO RELATED APPLICATIONS

This application claims, under 35 U.S.C. § 119, the priority of Korean Patent Application No. 10-2019-0020421, filed on Feb. 21, 2019, in the Korean Intellectual Property Office, the disclosure of which is incorporated herein by reference in its entirety.

TECHNICAL FIELD

The present disclosure relates to a conjugated polymer for a low-temperature process, more particularly to a conjugated polymer of a new structure, which allows preparation of a photoactive layer even at room temperature while maintaining superior efficiency and performance, a photoactive layer composition using the same, and an organic solar cell including the same.

BACKGROUND

A solar cell, which is a photoelectric device that converts solar energy to electrical energy, is drawing attentions as a next-generation energy resource. Solar cells can be largely classified into inorganic solar cells and organic solar cells. Depending on the structure of a photoactive layer, the organic solar cells are classified into a bilayer p-n junction type consisting of separate layers of a p-type semiconductor and an n-type semiconductor, and a bulk heterojunction type wherein a p-type semiconductor and an n-type semiconductor are mixed to form a single layer.

In 1986, C. Tang of Eastman Kodak first proposed the possibility of commercialization of the heterojunction using CuPc (copper pthalocyanine) and perylenetetracarboxylic derivatives as a solar cell.

In early 1990, Heeger's group reported a solar cell which generates electricity using a mixed layer of a conjugated polymer and a fullerene derivative (PC61BM) as a photoactive layer, which improved the solar cell efficiency up to 7-8%.

Such conjugated polymers (donor polymers) used for photoactive layers are polymers containing only one kind of electron-sufficient aromatic groups or push-pull type alternating copolymers in which electron-deficient aromatic groups are introduced into electron-sufficient aromatic groups. Due to their low bandgaps, these conjugated polymers effectively absorb sunlight over a wide range of wavelengths and exhibit superior electrical properties such as high charge carrier mobility, etc.

However, a high-temperature process is essential because the conjugated polymers have high crystallinity and low solubility. That is to say, despite the superior performance and various advantages, the efficiency and life characteristics of the organic solar cells are sacrificed by the high-temperature process required for their preparation. In addition, the complexity and risk of the process and the use of equipment and a lot of energy for the high-temperature process, the organic solar cells are not acknowledged as new energy source in economic aspects.

Although methods for preparing organic solar cells at low temperatures are being developed to solve this problem, there are problems that the uniformity, efficiency and reproducibility of photoactive layers formed using conjugated polymers are unsatisfactory.

Thus, there is a need to develop a new conjugated polymer which allows formation of a stable film even at low temperature while maintaining performance and efficiency.

REFERENCES OF THE RELATED ART

[Patent Document]
(Patent document 1) Patent document 1. Korean Patent Publication No. 10-2014-0043951.

SUMMARY

The present disclosure has been made in an effort to solve the above problems and is directed to providing a novel conjugated polymer for a low-temperature process of an organic solar cell or a photoactive layer, which has high solubility and crystallinity at low temperature.

The present disclosure is also directed to providing a photoactive layer composition containing the conjugated polymer and an organic solar cell that can be prepared at low temperature by using the same.

The present disclosure provides a conjugated polymer for low-temperature coating, which includes a repeating unit represented by the following Chemical Formula I.

[Chemical Formula I]

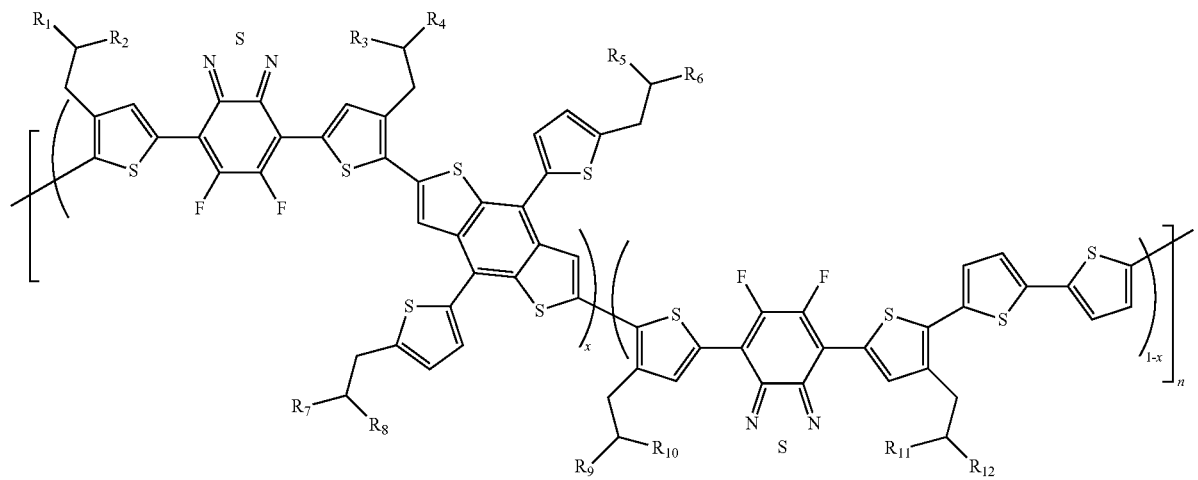

In Chemical Formula I, each of $R_1$ through $R_{12}$, which may be identical or different, is any one selected from hydrogen and a $C_1$-$C_{20}$ straight or branched alkyl group. And, x is a real number from 0.01 to 0.5 and n is an integer from 1 to 1,000.

In Chemical Formula I, $R_1$, $R_2$, $R_3$, $R_4$, $R_9$, $R_{10}$, $R_{11}$ and $R_{12}$ may be a $C_8$-$C_{10}$ straight alkyl group, and $R_5$, $R_6$, $R_7$ and $R_8$ may be a $C_2$-$C_4$ straight alkyl group.

Chemical Formula I may be represented by the following Chemical Formula Ia.

[Chemical Formula Ia]

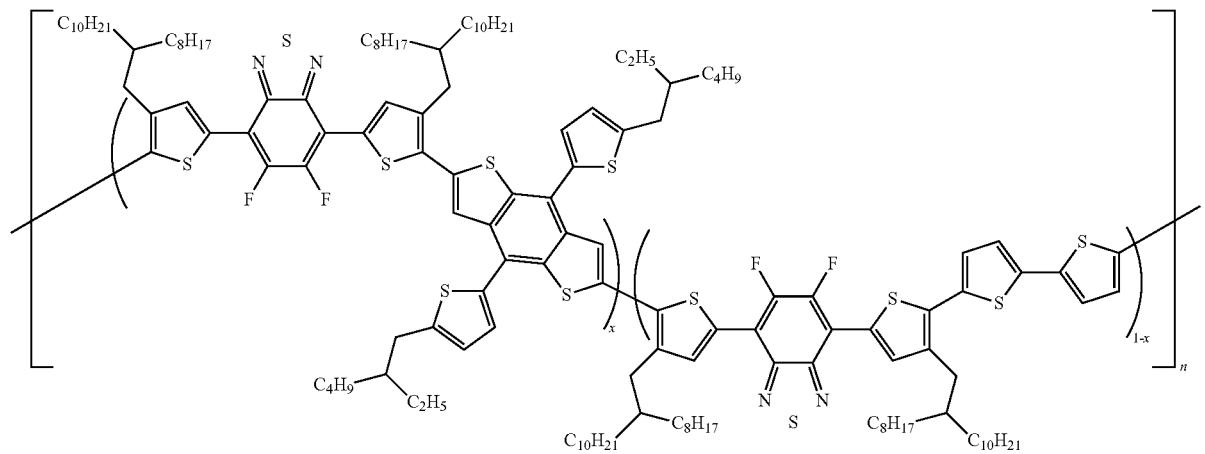

In Chemical Formula Ia, x is a real number from 0.1 to 0.2 and n is an integer from 1 to 1,000.

The present disclosure also provides a photoactive layer composition for an organic solar cell that can be coated at low temperature, which contains the conjugated polymer and a solvent.

The solvent may be one or more selected from a group consisting of chlorobenzene, chloroform, p-xylene, 1,2-dichlorobenzene, trichlorobenzene, toluene and 1,8-diiodooctane.

The solvent may be a mixture of chlorobenzene and 1,2-dichlorobenzene at a volume ratio of 1:0.5-2, or a mixture of chlorobenzene, 1,2-dichlorobenzene and 1,8-diiodooctane at a volume ratio of 1:0.5-2:0.001-0.03.

The photoactive layer composition may contain the conjugated polymer according to the present disclosure as an electron donor, and may further contain a fullerene derivative as an electron acceptor. Therefore, a photoactive layer prepared from the photoactive layer composition can provide a photovoltaic effect based on very fast charge transfer and separation between the electron donor and the electron acceptor.

The photoactive layer composition may further contain a fullerene derivative, and the fullerene derivative may be one or more selected from a group consisting of $C_{60}$, $C_{70}$, $C_{84}$, PC71BM, PC61BM, ICBA and ICMA.

The conjugated polymer and the fullerene derivative may be mixed at a weight ratio of 1:1-2. The conjugated polymer according to the present disclosure can exhibit remarkably superior performance even when the content of the fullerene derivative is low due to its high miscibility with the fullerene derivative. Most specifically, the conjugated polymer according to the present disclosure is mixed with the fullerene derivative at a weight ratio of 1:1.2-1.5 when considering cost and long-term stability.

The present disclosure also provides an organic solar cell including the photoactive layer.

Because the conjugated polymer according to the present disclosure allows formation of a uniform film over a large area without a heat treatment process, due to its superior solubility and crystallinity at low temperature, an organic solar cell can be prepared with high efficiency at low temperature.

In addition, because the conjugated polymer of the present disclosure exhibits superior crystallinity even without a heating process, a small-area or large-area organic solar cell with high energy conversion efficiency can be manufactured on a large scale at low cost.

DETAILED DESCRIPTION OF EMBODIMENTS

Figure 1:
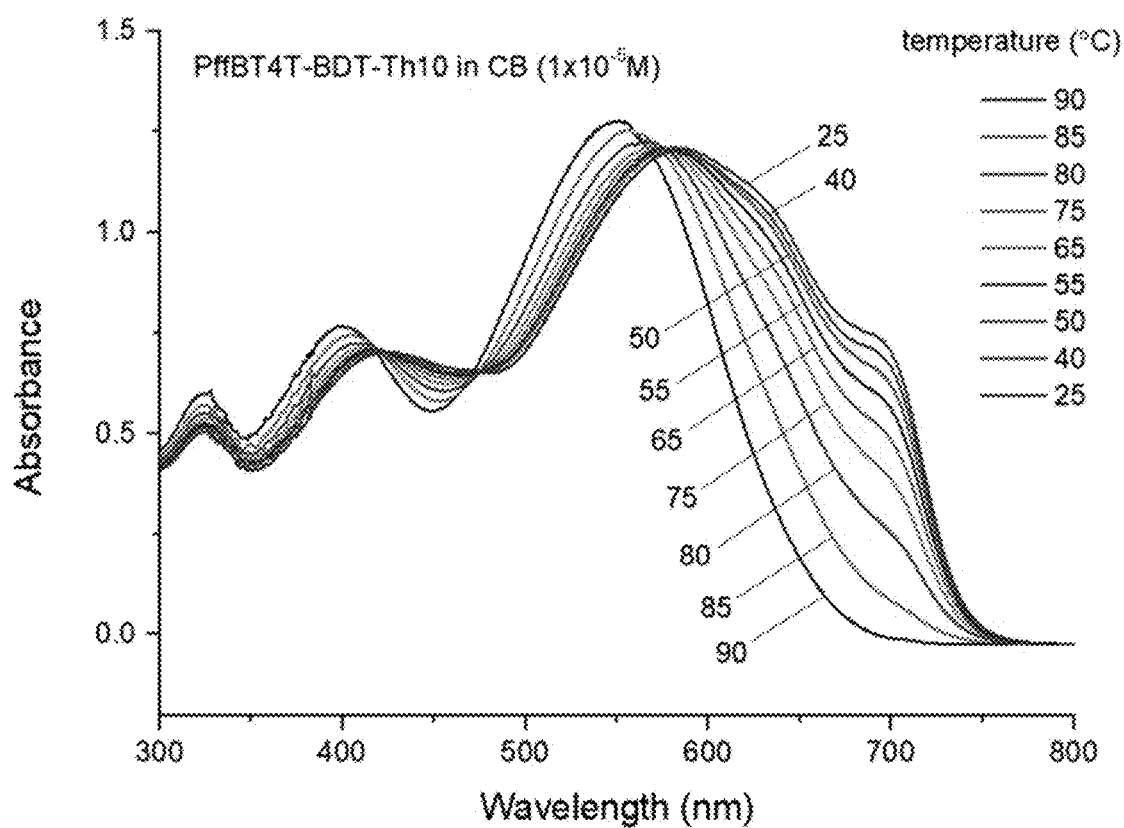
FIG. 1 shows the UV-vis absorption spectra of a conjugated polymer prepared in Preparation Example 1 measured in chlorobenzene (CB) at different temperatures.

Hereinafter, various aspects and exemplary embodiments of the present disclosure are described in more detail.

An aspect of the present disclosure relates to a conjugated polymer for low-temperature coating, which includes a repeating unit represented by the following Chemical Formula I.

[Chemical Formula I]

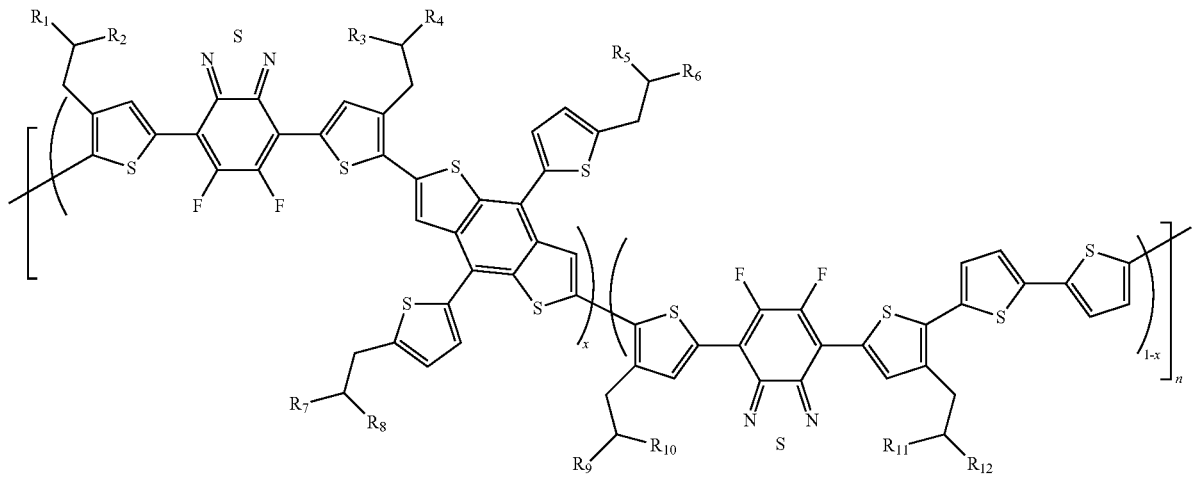

In Chemical Formula I, each of $R_1$ through $R_{12}$, which may be identical or different, is any one selected from hydrogen and a $C_1$-$C_{20}$ straight or branched alkyl group. And, x is a real number from 0.01 to 0.5 and n is an integer from 1 to 1,000.

More specifically, in order that a uniform photoactive layer composition for an organic solar cell can be formed by mixing with a fullerene derivative at 70° C. or lower, specifically in a temperature range of 10-50° C. without aggregation unlike the existing conjugated polymer, in Chemical Formula I, $R_1$, $R_2$, $R_3$, $R_4$, $R_9$, $R_{10}$, $R_{11}$ and $R_{12}$ may be a $C_8$-$C_{10}$ straight alkyl group, and $R_5$, $R_6$, $R_7$ and $R_8$ may be a $C_2$-$C_4$ straight alkyl group.

If the length of the alkyl group of $R_1$ through $R_{12}$ in the conjugated polymer according to the present disclosure is longer or shorter, the optimal solubility for application to an organic solar cell cannot be achieved.

Also, in Chemical Formula I, x may be a real number from 0.01 to 0.5, specifically a real number from 0.1 to 0.2. If x deviates from the range of 0.01-0.5, efficiency is decreased greatly due to low crystallinity of the conjugated polymer even when the alkyl group introduced at the side chain satisfies the above-described carbon number. And, if x deviates from the range of 0.1-0.2, the energy conversion efficiency of a large-area organic solar cell is decreased greatly when it is prepared by bar coating.

Accordingly, most specifically, in order that the conjugated polymer of new structure according to the present disclosure can exhibit its structural characteristics, in Chemical Formula I, $R_1$, $R_2$, $R_3$, $R_4$, $R_9$, $R_{10}$, $R_{11}$ and $R_{12}$ may be a $C_8$-$C_{10}$ straight alkyl group, $R_5$, $R_6$, $R_7$ and $R_8$ may be a $C_2$-$C_4$ straight alkyl group, and x may be a real number from 0.1 to 0.2.

Under this condition, the conjugated polymer of the present disclosure can maintain a uniform solution state at room temperature, low temperature and high temperature without aggregation. In addition, when the conjugated polymer of the present disclosure is mixed with a fullerene derivative to form a photoactive layer, it can be coated at a temperature below 70° C. without problems such as decrease in solubility, decline in performance and aggregation while the performance for a photoactive layer is maintained.

Due to its new structure, the conjugated polymer of the present disclosure has superior solubility and does not show aggregation at a processing temperature lower than 70° C., specifically 10-50° C., unlike the conjugated polymer to which only fluorine groups are introduced. Accordingly, a photoactive layer composition containing the conjugated polymer of the present disclosure or an organic solar cell fabricated using the same exhibits superior performance (optical short-circuit current, fill factor and energy conversion efficiency) in a room-temperature process.

In addition, a large-area (5.4 cm$^2$) organic solar cell fabricated below 70° C., specifically at 10-50° C., also achieves superior energy conversion efficiency of 7-8% or higher.

The energy conversion efficiency of an organic solar cell fabricated at room temperature using the existing conjugated polymer is only 4-5% and, even in this case, it is very difficult to obtain a uniform photoactive layer at room temperature due to aggregation. That is to say, because the existing conjugated polymer is not coated well below 70° C., specifically at a low temperature of 10-50° C., the reproducibility of organic solar cell fabrication is very low. In contrast, the conjugated polymer of the present disclosure enables fabrication of an organic solar cell with high reproducibility below 70° C., specifically at 10-50° C., and provides remarkably improved performance such as energy conversion efficiency, etc. as compared to the existing conjugated polymer.

More specifically, Chemical Formula I may be represented by Chemical Formula Ia.

[Chemical Formula Ia]

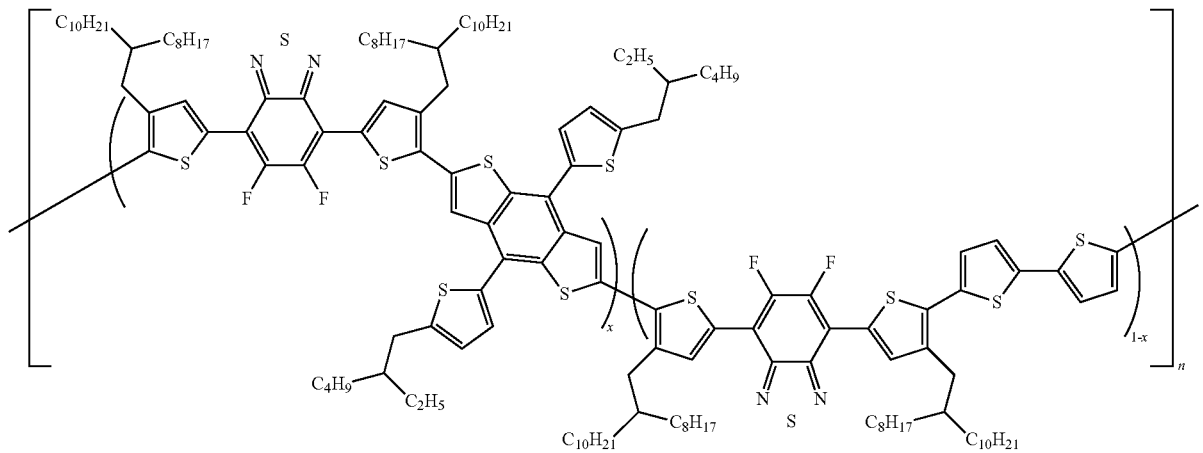

In Chemical Formula Ia, x is a real number from 0.1 to 0.2, and n is an integer from 1 to 1,000.

The conjugated polymer according to the present disclosure has remarkably improved solubility below 70° C., specifically at 10-50° C., while maintaining the inherent electrical and physical properties. Due to these characteristics, when applied to an organic solar cell, it provides superior compatibility with a fullerene derivative at low temperature and prevents the occurrence of phase separation. Therefore, a photoactive layer and an organic solar cell with improved performance can be prepared simply by drying at a processing temperature below 70° C., specifically 10-50° C.

In addition, because the conjugated polymer of the present disclosure enables preparation of not only a small-area but also large-area (5 cm$^2$ or greater) organic solar cell having superior performance at room temperature, processing cost and time can be saved significantly as compared to the existing conjugated polymer.

The conjugated polymer according to the present disclosure can be applied to various fields such as catalyst materials, biomaterials, medicine, nonlinear optical materials, organic electronic materials, etc.

The conjugated polymer according to the present disclosure may be prepared by a preparation method including the following steps:

I) a step of mixing monomers represented by Chemical Formulas A, B and C with a solvent; and II) a step of synthesizing a conjugated polymer including a repeating unit represented by Chemical Formula I by adding a catalyst to the mixture.

[Chemical Formula A]

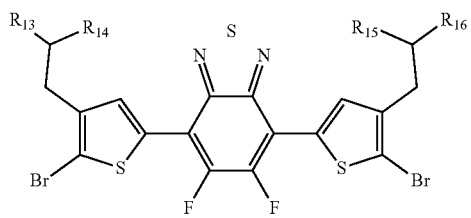

[Chemical Formula B]

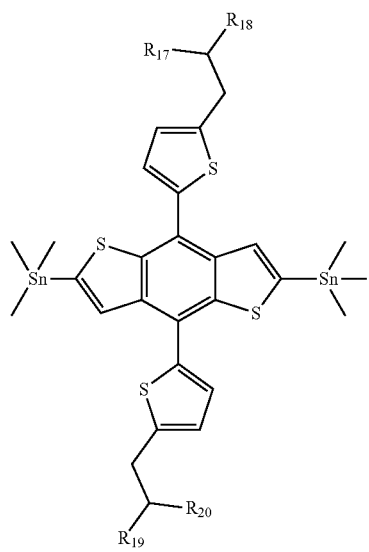

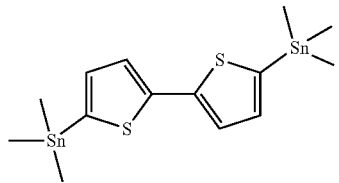

[Chemical Formula C]

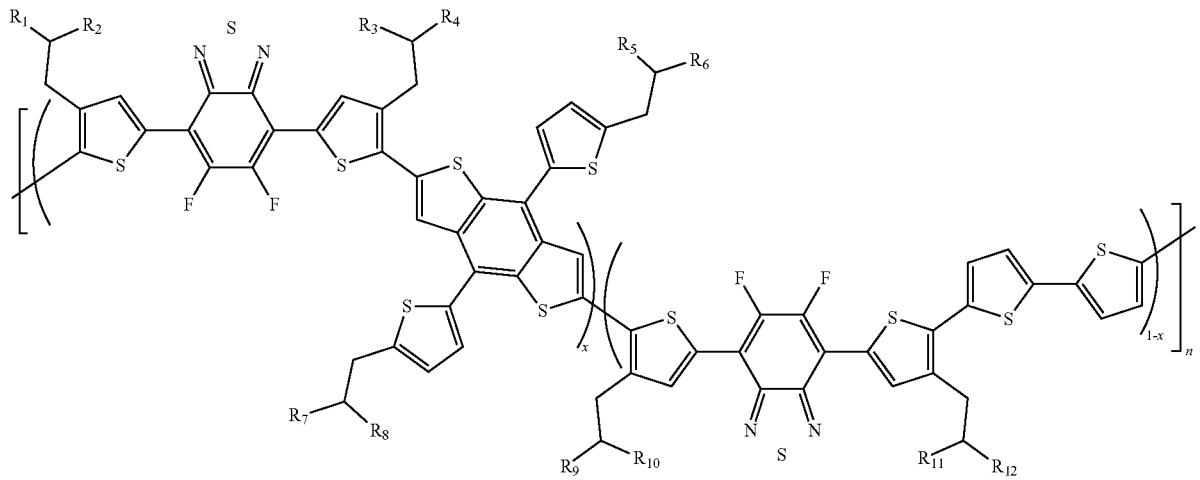

[Chemical Formula I]

In Chemical Formulas A, B, C and I, each of $R_1$ through $R_{20}$, which may be identical or different, is any one selected from hydrogen and a $C_1$-$C_{20}$ straight or branched alkyl group.

Description of the conjugated polymer including the repeating unit represented by Chemical Formula I will be omitted because it is the same as described above.

First, in the step I), the monomer represented by Chemical Formula A, the monomer represented by Chemical Formula B and the monomer represented by Chemical Formula C are mixed with a solvent.

In the step I), the monomer represented by Chemical Formula A, the monomer represented by Chemical Formula B and the monomer represented by Chemical Formula C may be mixed at a molar ratio of 1:0.01-0.5:0.5-0.99, more specifically 1:0.1-0.2:0.8-0.9.

And, the solvent may be one or more selected from toluene, chlorobenzene, N-methylpyrrolidone (NMP), dimethyl sulfoxide (DMSO) and dimethylformamide (DMF).

Because the conjugated polymer including the repeating unit represented by Chemical Formula I of the present disclosure is precipitated in solvents other than those described above, such as acetone, methanol, ethanol, isopropanol and ethyl acetate, the conjugated polymer including the repeating unit represented by Chemical Formula I of the present disclosure synthesized through the above preparation process may be separated by precipitating in a solvent such as acetone, methanol, ethanol, isopropanol, ethyl acetate, etc. This simple purification process for increasing the yield of the conjugated polymer of the present disclosure shortens the time required for the preparation.

Subsequently, in the step II), the conjugated polymer including the repeating unit represented by Chemical Formula I is synthesized by adding a catalyst to the mixture.

Specifically, the catalyst may be a palladium catalyst, and the palladium catalyst may be one or more selected from a group consisting of $PdCl_2$, $Pd(OAc)_2$, $Pd(CH_3CN)_2Cl_2$, $Pd(PhCN)_2Cl_2$, $Pd_2(dba)_3$, $Pd_2(dba)_3 \cdot CHCl_3$, $P(o\text{-tolyl})_3$, $PPh_3$ and $Pd(PPh_3)_4$.

The synthesis in the step II) may be performed at 100-200° C. If the synthesis temperature is 100° C., the reaction may proceed slowly and a large amount of unreacted reactants may remain. And, if the synthesis temperature exceeds 200° C., the reaction may not proceed properly due to evaporation of the solvent. Accordingly, the above temperature range is most preferred.

Additionally, in order to obtain the conjugated polymer with high yield, the preparation method may further include III) a step of precipitating the conjugated polymer by adding the synthesized conjugated polymer to a precipitant and then filtering the same.

The precipitant is a solvent that can precipitate the conjugated polymer. The precipitant is not particularly limited as long as it is a solvent capable of precipitating only the conjugated polymer from the reaction mixture containing the synthesized conjugated polymer. Specifically, it may be one or more selected from acetone, methanol, ethanol, isopropanol and ethyl acetate.

The precipitated conjugated polymer may be obtained through a filtration process.

Through the process above described, the conjugated polymer including the repeating unit represented by Chemical Formula I may be obtained with a yield of 80% or higher, specifically with a high yield of 90-99%.

Another aspect of the present disclosure relates to a photoactive layer composition for an organic solar cell that can be coated at low temperature, which contains the conjugated polymer and a solvent.

The solvent may be one or more selected from a group consisting of chlorobenzene, chloroform, p-xylene, 1,2-dichlorobenzene, trichlorobenzene, toluene and 1,8-diiodooctane.

Specifically, the solvent may be a mixture of chlorobenzene and 1,2-dichlorobenzene at a volume ratio of 1:0.5-2, or a mixture of chlorobenzene, 1,2-dichlorobenzene and 1,8-diiodooctane at a volume ratio of 1:0.5-2:0.001-0.03.

The photoactive layer composition may further contain a fullerene derivative, and the fullerene derivative may be one or more selected from a group consisting of $C_{60}$, $C_{70}$, $C_{84}$, PC71BM, PC61BM, ICBA and ICMA.

The conjugated polymer and the fullerene derivative may be mixed at a weight ratio of 1:1-2.

Another aspect of the present disclosure relates to an organic solar cell including the photoactive layer. The organic solar cell of the present disclosure is highly advantageous in terms of process because the photoactive layer is prepared reproducibly below 70° C., specifically at 10-50° C. In addition, it has superior energy conversion efficiency and life stability even though the photoactive layer can be prepared at low temperature.

The configuration of the organic solar cell is not particularly limited. Basically, it includes a first electrode, a photoactive layer and a second electrode, and a substrate, a buffer layer, etc. may be added depending on applications, if necessary.

The photoactive layer may be prepared by using a photoactive layer composition containing the conjugated polymer including the repeating unit represented by Chemical Formula I, and the photoactive layer composition may further contain a fullerene derivative as an electron acceptor.

As the first electrode, ITO (indium tin oxide), FTO (fluorine-doped tin oxide), ZnO—($Ga_2O_3$ or $Al_2O_3$), $SnO_2$—$Sb_2O_3$, etc. may be used. More specifically, ITO may be used.

A buffer layer may be formed on the first electrode. As the buffer layer, zinc oxide (ZnO) or polyethyleneimine ethoxylated (PEIE) may be used to improve electron mobility. The buffer layer may be formed by spin coating, etc.

The photoactive layer is formed on the buffer layer. Description of the photoactive layer will be omitted because it is the same as described above.

The conjugated polymer including the repeating unit represented by Chemical Formula I, which constitutes the photoactive layer, has better performance than the photoactive layer of the existing conjugated polymer even when it is prepared through a large-area process at room temperature due to the functions and effects (such as high solubility) mentioned above or demonstrated in the following experimental examples. Accordingly, the conjugated polymer can be prepared into a photoactive layer with superior efficiency through a room-temperature process using a shadow mask, including printing, spin coating, screen printing and doctor blade methods, and provides good advantageous in terms of process because no additional high-temperature process is necessary.

As the second electrode, one or more material selected from a group consisting of gold, aluminum, copper, silver, molybdenum oxide ($MoO_3$) and a combination thereof may be used. Specifically, silver or silver/molybdenum oxide ($MoO_3$) may be used.

Hereinafter, the present disclosure will be described in more detail through examples. However, the following examples are for illustrative purposes only and not intended to limit the scope of this disclosure.

Synthesis Example 1: Preparation of Monomer Represented by Chemical Formula 5

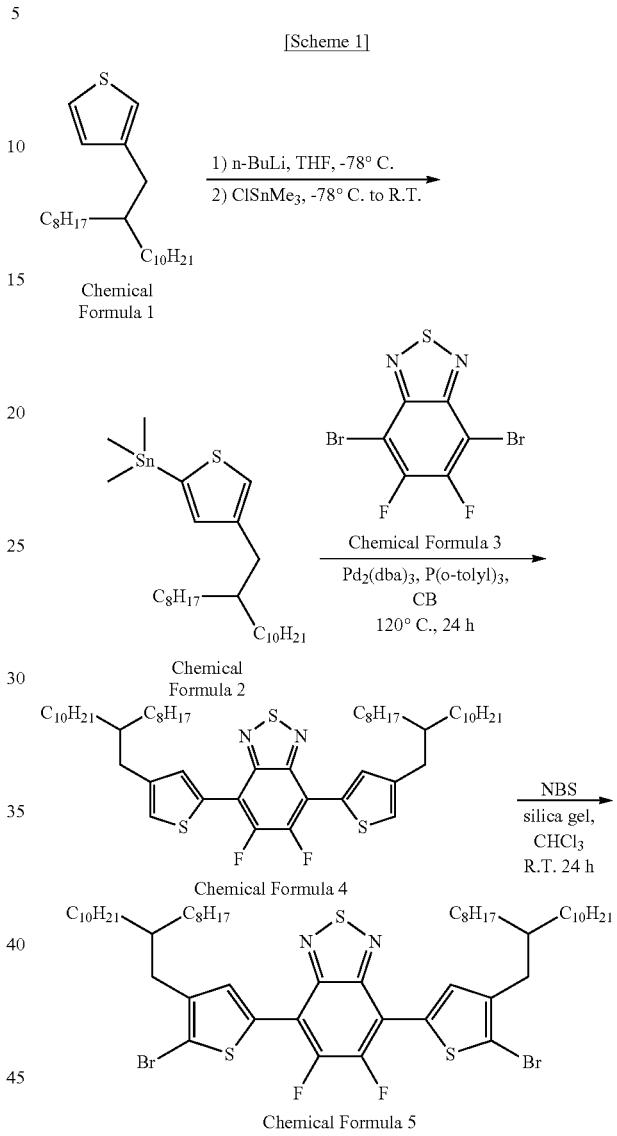

A monomer represented by Chemical Formula 5 was prepared according to Scheme 1 as follows.

1) Synthesis of (4-(2-octyldodecyl)thiophen-2-yl) trimethylstanne (Chemical Formula 2)

3-(2-Octyldodecyl)thiophene (2.0 g, 5.54 mmol) was dissolved in tetrahydrofuran (THF, 55 mL) and cooled to −78° C. After slowly adding LDA (lithium diisopropylamide, 1.0 M, 5.82 mL, 5.82 mmol) and reacting for 30 minutes at the same temperature, the solution was heated to 0° C. and reaction was performed additionally for 1 hour. After cooling the reaction flask again to −78° C. and adding a trimethyltin chloride solution (1 M in THF, 6.10 mL, 6.10 mmol), reaction was performed enough while raising the temperature slowly to room temperature. After stopping the reaction by adding distilled water, the reaction mixture wasextracted with ethyl ether and the solvent was removed from the organic layer using a rotary evaporator. Drying under vacuum gave the product (2.78 g, 95.2%), which was used for the next reaction without further purification.

$^1$H NMR (CDCl$_3$), δ (ppm): 7.19 (s, 1H), 7.00 (s, 1H), 2.62 (d, 2H), 1.65 (m, 1H), 1.20-1.40 (m, 32H), 0.85-0.98 (m, 6H), 0.20-0.58 (m, 9H).

2) Synthesis of 4,7-bis(4-(2-octyldodecyl)thiophen-2-yl)-5,6-difluoro[2,1,3]benzo Thiadiazole (Chemical Formula 4)

4,7-Dibromo-5,6-difluoro[2,1,3]benzothiadiazole (Chemical Formula 3) (730.7 mg, 2.21 mmol), tributyl(4-(2-octyldodecyl)-2-thienyl)stannane (Chemical Formula 2) (2.8 g, 5.31 mmol), tris(dibenzylideneacetone)dipalladium (0) (Pd$_2$(dba)$_3$, 194.7 mg, 0.21 mmol) and tri(o-tolyl)phosphine (P(o-tolyl)$_3$, 517.6 mg, 1.70 mmol) were placed in a reaction flask and purged with nitrogen for 30 minutes. Subsequently, anhydrous chlorobenzene (53 mL) was added and the mixture was heated for 24 hours under reflux. Then, after removing the solvent from the refluxed solution, the residue was purified by silica gel column chromatography using hexane as an eluent, affording 1.742 g (yield: 87.65%) of yellow solid.

$^1$H NMR (CDCl$_3$), δ (ppm): 7.93 (s, 2H), 6.97 (s, 2H), 2.52 (d, 4H), 1.64 (m, 2H), 1.00-1.48 (m, 64H), 0.77-0.94 (m, 12H).

3) Synthesis of 4,7-bis(5-bromo-4-(2-octyldodecyl)thiophen-2-yl)-5,6-difluoro[2,1,3] benzothiadiazole (Chemical Formula 5)

4,7-Bis(4-(2-octyldodecyl)thiophen-2-yl)-5,6-difluoro[2,1,3]benzothiadiazole (Chemical Formula 4) (1.742 g, 1.94 mmol) and silica gel (256.6 mg) were dissolved in a chloroform/acetic acid mixture (chloroform:acetic acid, volume ratio 2:1, 58.2 mL). After slowly adding N-bromosuccinimide (NBS, 760 mg, 4.27 mmol) to the mixture solution, reaction was conducted sufficiently at room temperature. Upon completion of the reaction, the mixture solution was extracted with chloroform after adding an aqueous solution of sodium bicarbonate (NaHCO$_3$). After removing the solvent using a rotary evaporator, the residue was purified by column chromatography using hexane and then precipitated in cold methanol, affording 1.873 g of 4,7-bis(5-bromo-4-(2-octyldodecyl)thiophen-2-yl)-5,6-difluoro[2,1,3] benzothiadiazole (Chemical Formula 5) (yield: 91.44%).

$^1$H NMR (CDCl$_3$), δ (ppm): 7.93 (s, 2H), 2.59 (d, 4H), 1.75 (m, 2H), 1.14-1.43 (m, 64H), 0.80-0.93 (m, 12H).

Synthesis Example 2: Preparation of Monomer Represented by Chemical Formula 9

[Scheme 2]

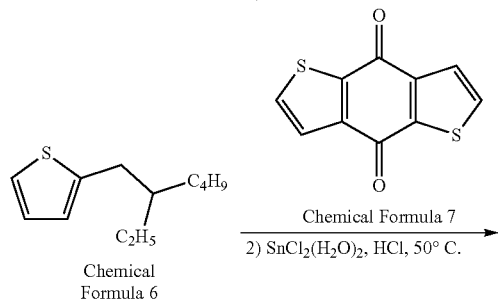

Chemical Formula 6

Chemical Formula 7

1) n-BuLi, THF, -78° C.
2) SnCl$_2$(H$_2$O)$_2$, HCl, 50° C.

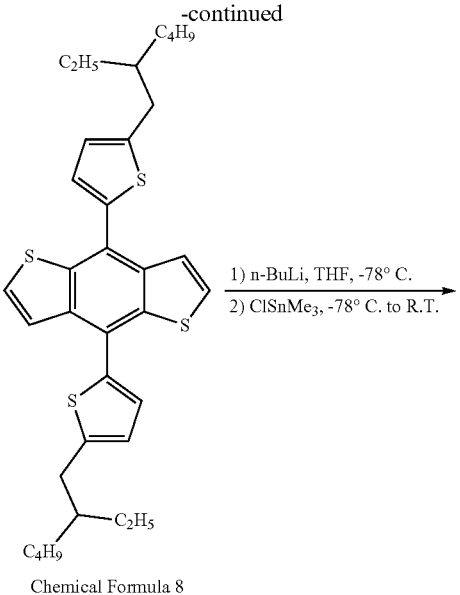

Chemical Formula 8

1) n-BuLi, THF, -78° C.
2) ClSnMe$_3$, -78° C. to R.T.

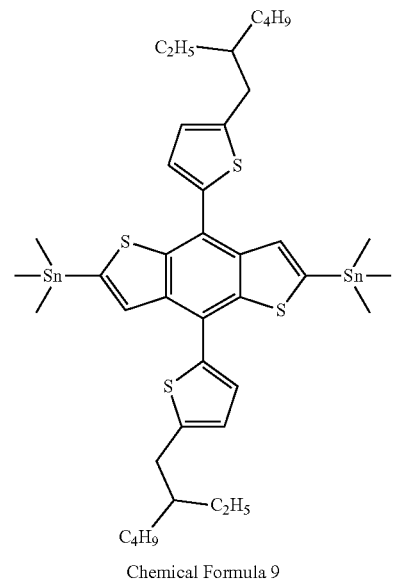

Chemical Formula 9

A monomer represented by Chemical Formula 9 was prepared according to Scheme 2 as follows.

1) Synthesis of 4,8-bis(5-(2-ethylhexyl)thiophen-2-yl)benzo[1,2-b:4,5-b']dithiophene (Chemical Formula 8)

2-(2-Ethylhexyl)thiophene (Chemical Formula 6) (6.8 g, 35 mmol) was dissolved in anhydrous THF (40 mL) and cooled to 0° C. After slowly injecting n-BuLi (21.6 mL, 1.6 M, 35 mmol), reaction was conducted for 2 hours by raising the temperature to 50° C. Benzo[1,2-b:4,5-b']dithiophene-4,8-dione (Chemical Formula 7) (3.3 g, 15 mmol) was added to the reaction flask and reaction was conducted for 1.5 hours. After adding tin(II) chloride dehydrate (SnCl$_2$.2H$_2$O, 27 g, 0.1 mol) dissolved in 10% HCl (40 mL) to the reaction flask, reaction was conducted additionally for 2 hours. After completion of the reaction, the reaction solution was extracted with diethyl ether. After removing the solvent, the residue was purified by silica gel column chromatography (DCM:Hex=1:10), affording 4.1 g of the product (yield: 47.7%).

$^1$H NMR (CDCl$_3$), δ (ppm): 7.67 (d, 2H), 7.48 (d, 2H), 7.32 (d, 2H), 6.92 (d, 2H), 2.89 (d, 4H), 1.72 (m, 2H), 1.25-1.54 (m, 16H), 0.87-1.05 (m, 12H).

2) Synthesis of (4,8-bis(5-(2-ethylhexyl)thiophen-2-yl)benzo[1,2-b:4,5-b']dithiophene-2,6-diyl)bis(trimethylstannane) (Chemical Formula 9)

4,8-Bis(5-(2-ethylhexyl)thiophen-2-yl)benzo[1,2-b:4,5-b']dithiophene (Chemical Formula 8) (1.22 g, 2.11 mmol) was added to anhydrous THF (21.1 mL). The solution was cooled to −78° C. and n-BuLi (3.2 mL, 1.6 M, 5.06 mmol) was added slowly dropwise. After raising the temperature to room temperature, the solution was allowed to react for 30 minutes and then cooled again to −78° C. After adding a chlorotrimethylstannane solution (ClSnMe$_3$, 1 M, 6.33 mL, 6.33 mmol) and carrying out reaction for 24 hours under stirring, the reaction was quenched by adding water. A monomer 4,8-bis(5-(2-ethylhexyl)thiophen-2-yl)benzo[1,2-b:4,5-b']dithiophene-2,6-diylbis(trimethylstannane) (Chemical Formula 9) was extracted with diethyl ether. After dehydrating the organic layer with magnesium sulfate and removing the solvent using a rotary evaporator, the residue was recrystallized in an isopropanol solvent, affording 1.41 g of the monomer represented by Chemical Formula 9 (yield: 73.7%)

$^1$H NMR (CDCl$_3$), δ (ppm): 7.66 (s, 2H), 7.31 (d, 2H), 6.90 (d, 2H), 2.87 (d, 4H), 1.68 (m, 2H), 1.20-1.50 (m, 16H), 0.82-1.00 (m, 12H), 0.20-0.58 (s, 18H).

Synthesis Example 3: Preparation of Monomer Represented by Chemical Formula 11

[Scheme 3]

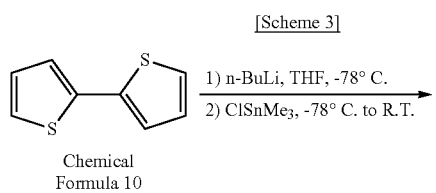

Chemical Formula 10

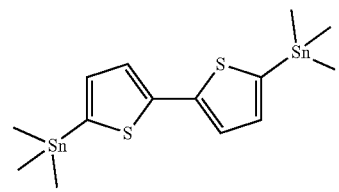

Chemical Formula 11

A monomer represented by Chemical Formula 11 (5,5'-bis(trimethylstannyl)-2,2'-bithiophene) was prepared according to Scheme 3 as follows.

2,2'-Bithiophene (Chemical Formula 10) (2.0 g, 12.03 mmol) was dissolved in anhydrous THF (60 mL) and cooled to −78° C. under an argon atmosphere. After slowly adding n-BuLi (15.8 mL, 1.6 M, 25.26 mmol) and carrying out reaction at −78° C. for 1 hour, the temperature was raised to room temperature and reaction was carried out for 1 hour. Subsequently, after cooling to −78° C. and adding a chlorotrimethylstannane solution (ClSnMe$_3$, 1 M, 26.46 mL, 26.46 mmol), the reaction mixture was reacted sufficiently at room temperature for 24 hours. After quenching the reaction by adding water, extracting with diethyl ether and removing the solvent, the residue was recrystallized in isopropyl alcohol (IPA), affording 3.8 g of a monomer represented by Chemical Formula 11 (yield: 64.2%).

$^1$H NMR (CDCl$_3$), δ (ppm): 7.27 (d, 2H), 7.08 (d, 2H), 0.19-0.56 (s, 18H).

Preparation Example 1: Preparation of Conjugated Polymer (BDT-Th10)

Scheme 4

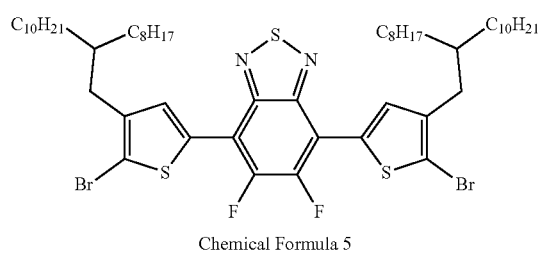

Chemical Formula 5

+

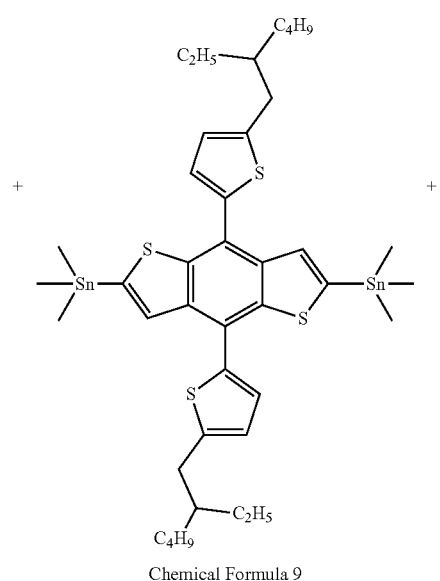

Chemical Formula 9

+

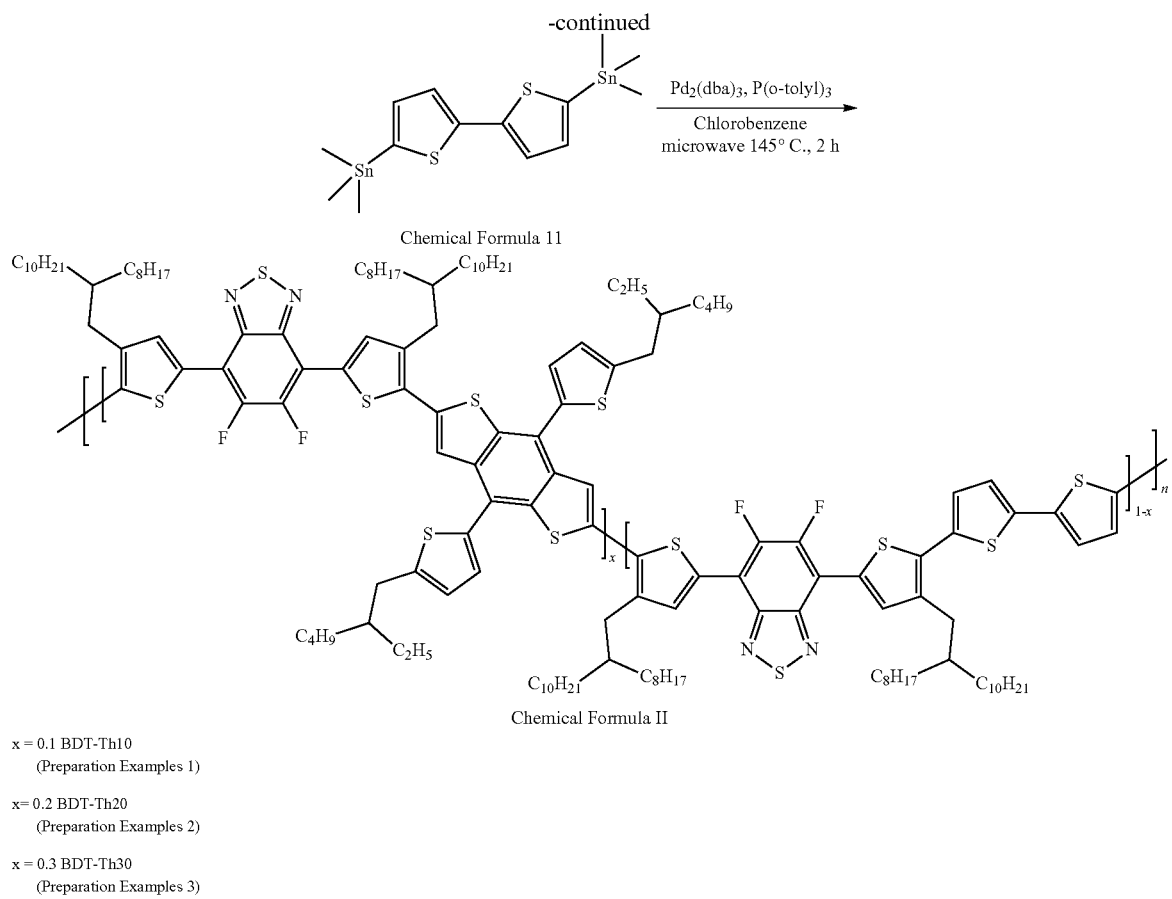

-continued

Chemical Formula 11

Chemical Formula II x = 0.1 BDT-Th10
(Preparation Examples 1)

x = 0.2 BDT-Th20
(Preparation Examples 2)

x = 0.3 BDT-Th30
(Preparation Examples 3)

A conjugated polymer represented by Chemical Formula II according to the present disclosure was prepared according to Scheme 4. Detailed procedures depending on the specific molar ratios of the conjugated polymer are described in Preparation Examples 1-3.

The monomer prepared in Synthesis Example 1 (4,7-bis(5-bromo-4-(2-octyldodecyl)thiophen-2-yl)-5,6-difluoro[2,1,3]benzothiadiazole (Chemical Formula 5)) (316.6 mg, 0.3 mmol), the monomer prepared in Synthesis Example 2 ((4,8-bis(5-(2-ethylhexyl)thiophen-2-yl)benzo[1,2-b:4,5-b']dithiophene-2,6-diyl)bis(trimethylstannane) (Chemical Formula 9)) (27.1 mg, 0.03 mmol), the monomer prepared in Synthesis Example 3 (5,5'-bis(trimethylstannyl)-2,2'-bithiophene (Chemical Formula 11)) (132.8 mg, 0.27 mmol), tris(dibenzylideneacetone)dipalladium(0) (Pd$_2$(dba)$_3$, 5.5 mg, 6.0 µmol) and tri(o-tolyl)phosphine (P(o-tolyl)$_3$, 14.6 mg, 48.0 µmol) were prepared.

The monomers and compounds were placed in a reaction flask and dissolved by adding degassed chlorobenzene (CB, 3.0 mL). After purging with argon for 20 minutes, a conjugated polymer including a repeating unit represented by Chemical Formula Ia (x=0.1) was synthesized by carrying out reaction at 145° C. for 2 hours in a microwave reactor. After the reaction was completed, the reaction solution was diluted with chlorobenzene and precipitated in acetone. The precipitated conjugated polymer was filtered through a thimble filter and purified by Soxhlet extraction sequentially with methanol, hexane, ethyl acetate and chloroform. The chloroform solution was concentrated, reprecipitated in acetone and then filtered, affording 315.5 mg of a conjugated polymer (BDT-Th10) (yield: 94.9%).

$M_n$=23.7 kDa, PDI=2.8.

Preparation Example 2: Preparation of Conjugated Polymer (BDT-Th20)

The monomer prepared in Synthesis Example 1 (4,7-bis(5-bromo-4-(2-octyldodecyl)thiophen-2-yl)-5,6-difluoro[2,1,3]benzothiadiazole (Chemical Formula 5)) (316.6 mg, 0.3 mmol), the monomer prepared in Synthesis Example 2 ((4,8-bis(5-(2-ethylhexyl)thiophen-2-yl)benzo[1,2-b:4,5-b']dithiophene-2,6-diyl)bis(trimethylstannane) (Chemical Formula 9)) (54.3 mg, 0.06 mmol), the monomer prepared in Synthesis Example 3 (5,5'-bis(trimethylstannyl)-2,2'-bithiophene (Chemical Formula 11)) (118.0 mg, 0.24 mmol), tris(dibenzylideneacetone)dipalladium(0) (Pd$_2$(dba)$_3$, 5.5 mg, 6.0 µmol) and tri(o-tolyl)phosphine (P(o-tolyl)$_3$, 14.6 mg, 48.0 µmol) were prepared.

The monomers and compounds were placed in a reaction flask and dissolved by adding degassed chlorobenzene (CB, 3.0 mL). After purging with argon for 20 minutes, a conjugated polymer including a repeating unit represented by Chemical Formula Ia (x=0.2) was synthesized by carrying out reaction at 145° C. for 2 hours in a microwave reactor. After the reaction was completed, the reaction solution was diluted with chlorobenzene and precipitated in acetone. The precipitated polymer was filtered through a thimble filter and purified by Soxhlet extraction sequentially with methanol, hexane, ethyl acetate and chloroform. The chloroform solution was concentrated, reprecipitated in acetone and then filtered, affording 328 mg of a conjugated polymer (BDT-Th20) (yield: 95.7%).

$M_n$=22.6 kDa, PDI=1.48.

Preparation Example 3: Preparation of Conjugated Polymer (BDT-Th30)

The monomer prepared in Synthesis Example 1 (4,7-bis(5-bromo-4-(2-octyldodecyl)thiophen-2-yl)-5,6-difluoro[2,1,3]benzothiadiazole (Chemical Formula 5)) (316.6 mg, 0.3 mmol), the monomer prepared in Synthesis Example 2 ((4,8-bis(5-(2-ethylhexyl)thiophen-2-yl)benzo[1,2-b:4,5-b']dithiophene-2,6-diyl)bis(trimethylstannane) (Chemical Formula 9)) (81.4 mg, 0.09 mmol), the monomer prepared in Synthesis Example 3 (5,5'-bis(trimethylstannyl)-2,2'-bithiophene (Chemical Formula 11)) (103.3 mg, 0.21 mmol), tris(dibenzylideneacetone)dipalladium(0) (Pd$_2$(dba)$_3$, 5.5 mg, 6.0 μmol) and tri(o-tolyl)phosphine (P(o-tolyl)$_3$, 14.6 mg, 48.0 μmol) were prepared.

The monomers and compounds were placed in a reaction flask and dissolved by adding degassed chlorobenzene (CB, 6.0 mL). After purging with argon for 20 minutes, a conjugated polymer including a repeating unit represented by Chemical Formula Ia (x=0.3) was synthesized by carrying out reaction at 145° C. for 2 hours in a microwave reactor. After the reaction was completed, the reaction solution was diluted with chlorobenzene and precipitated in acetone. The precipitated polymer was filtered through a thimble filter and purified by Soxhlet extraction sequentially with methanol, hexane, ethyl acetate and chloroform. The chloroform solution was concentrated, reprecipitated in acetone and then filtered, affording 328 mg of a conjugated polymer (BDT-Th30) (yield: 95.7%).

$M_n$=28.9 kDa, PDI=1.54.

Comparative Preparation Example 1: Preparation of Conjugated Polymer (PffBT4T-OD)

[Scheme 5]

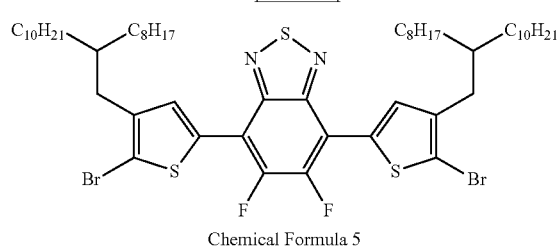

Chemical Formula 5

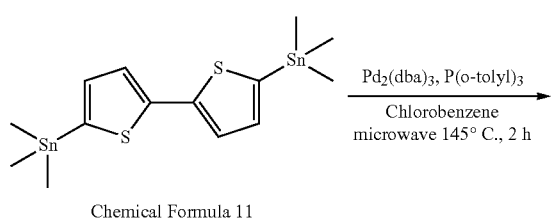

Chemical Formula 11

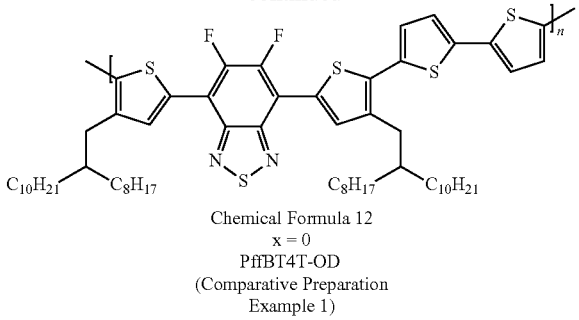

Chemical Formula 12
x = 0
PffBT4T-OD
(Comparative Preparation Example 1)

A conjugated polymer represented by Chemical Formula 12 was prepared according to Scheme 5 as follows.

The monomer prepared in Synthesis Example 1 (4,7-bis(5-bromo-4-(2-octyldodecyl)thiophen-2-yl)-5,6-difluoro[2,1,3]benzothiadiazole (Chemical Formula 5)) (316.6 mg, 0.3 mmol), the monomer prepared in Synthesis Example 3 (5,5'-bis(trimethylstannyl)-2,2'-bithiophene (Chemical Formula 11)) (147.6 mg, 0.3 mmol), tris(dibenzylideneacetone)dipalladium(0) (Pd$_2$(dba)$_3$, 5.5 mg, 6.0 μmol) and tri(o-tolyl)phosphine (P(o-tolyl)$_3$, 14.6 mg, 48.0 μmol) were prepared.

The monomers and compounds were placed in a reaction flask and dissolved by adding degassed chlorobenzene (CB, 3.0 mL). After purging with argon for 20 minutes, reaction was carried out at 145° C. for 2 hours in a microwave reactor. After the reaction was completed, the reaction solution was diluted with chlorobenzene and precipitated in acetone. The precipitated polymer was filtered through a thimble filter and purified by Soxhlet extraction sequentially with methanol, hexane, ethyl acetate and chloroform. The chloroform solution was concentrated, reprecipitated in acetone and then filtered, affording 289 mg of a conjugated polymer (PffBT4T-OD) (yield: 90.9%).

$M_n$=35.1 kDa, PDI=1.40.

Example 1. Preparation of BDT-Th10 Organic Thin Film

A glass substrate was washed sequentially with isopropyl alcohol for 10 minutes, with acetone for 10 minutes and with isopropyl alcohol for 10 minutes in an ultrasonic cleaner, and then dried before use. A zinc oxide (ZnO) solution was spin coated on the dried glass substrate and then heat-treated at 200° C. for 30 minutes.

The zinc oxide solution was prepared by dissolving 1 g of zinc acetate dihydrate and 0.28 of ethanolamine in 10 mL of 2-methoxyethanol and then stirring for 12 hours.

Then, a composition was prepared by adding the conjugated polymer BDT-Th10 (16 mg) obtained in Preparation Example 1 to 1 mL of a mixture solvent of chlorobenzene and 1,2-dichlorobenzene (volume ratio 1:1).

The prepared composition was spin coated on the ZnO-coated glass substrate at room temperature and 600 rpm and then heat-treated at 85° C. for 5 minutes to prepare a BDT-Th10 thin film.

Example 2. Preparation of BDT-Th20 Organic Thin Film

A BDT-Th20 organic thin film was prepared in the same manner as in Example 1, except that the conjugated polymer BDT-Th20 (15 mg) obtained in Preparation Example 2 was used instead of the conjugated polymer BDT-Th10 (10 mg) obtained in Preparation Example 1.

Example 3. Preparation of BDT-Th30 Organic Thin Film

A BDT-Th30 organic thin film was prepared in the same manner as in Example 1, except that the conjugated polymer BDT-Th30 (14 mg) obtained in Preparation Example 3 was used instead of the conjugated polymer BDT-Th10 (10 mg) obtained in Preparation Example 1.

Example 4. Preparation of BDT-Th10:PC71BM Photoactive Layer

An indium tin oxide (ITO) substrate was washed sequentially with isopropyl alcohol for 10 minutes, with acetone for 10 minutes and with isopropyl alcohol for 10 minutes in an ultrasonic cleaner, and then dried before use. A zinc oxide (ZnO) solution was spin coated on the dried indium tin oxide (ITO) substrate and then heat-treated at 200° C. for 30 minutes.

Then, 1 mL of a first solution was prepared by mixing chlorobenzene, 1,2-dichlorobenzene and 1,8-diiodooctane at a volume ratio of 1:1:0.003. A composition for preparing a photoactive layer was prepared by adding the conjugated polymer BDT-Th10 (16 mg) obtained in Preparation Example 1 and PC71BM (19.2 mg). The conjugated polymer and the PC71BM were used at a weight ratio of 1:1.2.

The prepared mixture solution was spin coated on the ZnO-coated ITO substrate at room temperature and 600 rpm and then heat-treated at 85° C. for 5 minutes to prepare a BDT-Th10:PC71 BM photoactive layer (small area: 1 cm$^2$).

Example 5. Preparation of BDT-Th20:PC71BM Photoactive Layer

A BDT-Th20:PC71BM photoactive layer (small area: 1 cm$^2$) was prepared in the same manner as in Example 4, except that the conjugated polymer BDT-Th20 (15 mg) obtained in Preparation Example 2 was used instead of the conjugated polymer BDT-Th10 (16 mg) obtained in Preparation Example 1 and 18 mg of PC71BM was used instead of 19.2 mg. The conjugated polymer and the PC71BM were used at a weight ratio of 1:1.4.

Example 6. Preparation of BDT-Th30:PC71BM Photoactive Layer

A BDT-Th30:PC71BM photoactive layer (small area: 1 cm$^2$) was prepared in the same manner as in Example 4, except that the conjugated polymer BDT-Th30 (14 mg) obtained in Preparation Example 3 was used instead of the conjugated polymer BDT-Th10 (16 mg) obtained in Preparation Example 1 and 21 mg of PC71BM was used instead of 19.2 mg. The conjugated polymer and the PC71BM were used at a weight ratio of 1:1.5.

Example 7. Preparation of BDT-Th10:PC71BM Photoactive Layer by Bar Coating

An indium tin oxide (ITO) substrate was washed sequentially with isopropyl alcohol for 10 minutes, with acetone for 10 minutes and with isopropyl alcohol for 10 minutes in an ultrasonic cleaner, and then dried before use. A zinc oxide (ZnO) solution was spin coated on the dried indium tin oxide (ITO) substrate and then heat-treated at 200° C. for 30 minutes.

Then, chlorobenzene and 1,2-dichlorobenzene were mixed at a volume ratio of 1:1. A photoactive layer composition was prepared by adding the conjugated polymer BDT-Th10 (10 mg) obtained in Preparation Example 1 and PC71BM (12 mg) to 1 mL of the mixture solution. The conjugated polymer and the PC71BM were used at a weight ratio of 1:1.2.

The prepared photoactive layer composition was bar coated on the ZnO-coated ITO substrate at room temperature and 30 mm/s to form 4 striped patterns. Then, a BDT-Th10:PC71BM photoactive layer (large area: 8.4 cm$^2$) was fabricated by drying under vacuum for 3 hours without any heat treatment.

Example 8. Preparation of BDT-Th20:PC71BM Photoactive Layer by Bar Coating

A BDT-Th20:PC71BM photoactive layer (large area: 8.4 cm$^2$) was fabricated in the same manner as in Example 7, except that the conjugated polymer BDT-Th20 obtained in Preparation Example 2 was used instead of the conjugated polymer BDT-Th10 obtained in Preparation Example 1 and bar coating was performed at 25 mm/s to form the striped patterns.

Example 9. Preparation of BDT-Th30:PC71BM Photoactive Layer by Bar Coating

A BDT-Th30:PC71BM photoactive layer (large area: 8.4 cm$^2$) was fabricated in the same manner as in Example 7, except that the conjugated polymer BDT-Th30 obtained in Preparation Example 3 was used instead of the conjugated polymer BDT-Th10 obtained in Preparation Example 1 and bar coating was performed at 25 mm/s to form the striped patterns.

Example 10. Fabrication of Organic Solar Cell Including BDT-Th10:PC71BM Photoactive Layer (Spin Coating)

A molybdenum oxide (MoO$_3$) layer was deposited to a thickness of 3 nm on the BDT-Th10:PC71BM photoactive layer (spin coating) prepared in Example 4 and a silver electrode was deposited to a thickness of 100 nm to fabricate an organic solar cell with a structure of ITO/ZnO/BDT-Th10:PC71BM/MoO$_3$/Ag (small area: 0.12 cm$^2$).

Example 11. Fabrication of Organic Solar Cell Including BDT-Th20:PC71BM Photoactive Layer (Spin Coating)

A molybdenum oxide (MoO$_3$) layer was deposited to a thickness of 3 nm on the BDT-Th20:PC71BM photoactive layer (spin coating) prepared in Example 5 and a silver electrode was deposited to a thickness of 100 nm to fabricate an organic solar cell with a structure of ITO/ZnO/BDT-Th20:PC71BM/MoO$_3$/Ag (small area: 0.12 cm$^2$).

Example 12. Fabrication of Organic Solar Cell Including BDT-Th30:PC71BM Photoactive Layer (Spin Coating)

A molybdenum oxide (MoO$_3$) layer was deposited to a thickness of 3 nm on the BDT-Th30:PC71BM photoactive layer (spin coating) prepared in Example 6 and a silver electrode was deposited to a thickness of 100 nm to fabricate an organic solar cell with a structure of ITO/ZnO/BDT-Th30:PC71BM/MoO$_3$/Ag (small area: 0.12 cm$^2$).

Example 13. Fabrication of Organic Solar Cell Including BDT-Th10:PC71BM Photoactive Layer (Bar Coating)

A molybdenum oxide (MoO$_3$) layer was deposited to a thickness of 3 nm on the BDT-Th10:PC71BM photoactive layer (bar coating) prepared in Example 7 and a silver electrode was deposited to a thickness of 100 nm to fabricate an organic solar cell with a structure of ITO/ZnO/BDT-Th10:PC71BM/MoO$_3$/Ag (large area: 5.4 cm$^2$).

Example 14. Fabrication of Organic Solar Cell Including BDT-Th20:PC71BM Photoactive Layer (Bar Coating)

A molybdenum oxide (MoO$_3$) layer was deposited to a thickness of 3 nm on the BDT-Th20:PC71BM photoactive layer (bar coating) prepared in Example 8 and a silver electrode was deposited to a thickness of 100 nm to fabricate an organic solar cell with a structure of ITO/ZnO/BDT-Th20:PC71BM/MoO$_3$/Ag (large area: 5.4 cm$^2$).

Example 15. Fabrication of Organic Solar Cell Including BDT-Th30:PC71BM Photoactive Layer (Bar Coating)

A molybdenum oxide (MoO$_3$) layer was deposited to a thickness of 3 nm on the BDT-Th30:PC71BM photoactive layer (bar coating) prepared in Example 9 and a silver electrode was deposited to a thickness of 100 nm to fabricate an organic solar cell with a structure of ITO/ZnO/BDT-Th30:PC71BM/MoO$_3$/Ag (large area: 5.4 cm$^2$).

Comparative Example 1. Fabrication of Organic Solar Cell Including PffBT4T-OD:PC71BM Photoactive Layer (Spin Coating)

An indium tin oxide (ITO) substrate was washed sequentially with isopropyl alcohol for 10 minutes, with acetone for 10 minutes and with isopropyl alcohol for 10 minutes in an ultrasonic cleaner, and then dried before use. A zinc oxide (ZnO) solution was spin coated on the dried indium tin oxide (ITO) substrate and then heat-treated at 200° C. for 30 minutes.

Then, chlorobenzene, 1,2-dichlorobenzene and 1,8-diiodooctane were mixed at a volume ratio of 1:1:0.003 and a photoactive layer composition was prepared by adding the conjugated polymer PffBT4T-OD (12 mg) prepared by Chemical Formula 12, which was synthesized in Comparative Preparation Example 1, and PC71BM (14.4 mg) to 1 mL of the mixture solution. The conjugated polymer and the PC71BM were used at a weight ratio of 1:1.2.

The prepared photoactive layer composition was spin coated on the ZnO-coated ITO substrate at room temperature and 600 rpm and then heat-treated at 85° C. for 5 minutes to fabricate a PffBT4T-OD:PC71BM photoactive layer (small area: 0.12 cm$^2$).

A molybdenum oxide (MoO$_3$) layer was deposited to a thickness of 3 nm on the PffBT4T-OD:PC71BM photoactive layer and a silver electrode was deposited to a thickness of 100 nm to fabricate an organic solar cell with a structure of ITO/ZnO/PffBT4T-OD:PC71BM/MoO$_3$/Ag (small area: 0.12 cm$^2$).

Comparative Example 2. Fabrication of Organic Solar Cell Including PffBT4T-OD:PC71BM Photoactive Layer (Bar Coating)

An indium tin oxide (ITO) substrate was washed sequentially with isopropyl alcohol for 10 minutes, with acetone for 10 minutes and with isopropyl alcohol for 10 minutes in an ultrasonic cleaner, and then dried before use. A zinc oxide (ZnO) solution was spin coated on the dried indium tin oxide (ITO) substrate and then heat-treated at 200° C. for 30 minutes.

Then, chlorobenzene, 1,2-dichlorobenzene and 1,8-diiodooctane were mixed at a volume ratio of 1:1:0.003 and a photoactive layer composition was prepared by adding the conjugated polymer PffBT4T-OD (12 mg) prepared by Chemical Formula 12, which was synthesized in Comparative Preparation Example 1, and PC71BM (14.4 mg) to 1 mL of the mixture solution. The conjugated polymer and the PC71BM were used at a weight ratio of 1:1.2.

The prepared photoactive layer composition was bar coated on the ZnO-coated ITO substrate at room temperature and 25 mm/s to form 4 striped patterns. Then, a PffBT4T-OD:PC71BM photoactive layer (large area: 5.4 cm$^2$) was fabricated by drying under vacuum for 3 hours without any heat treatment.

A molybdenum oxide (MoO$_3$) layer was deposited to a thickness of 3 nm on the PffBT4T-OD:PC71BM photoactive layer and a silver electrode was deposited to a thickness of 100 nm to fabricate an organic solar cell with a structure of ITO/ZnO/PffBT4T-OD:PC71BM/MoO$_3$/Ag (large area: 5.4 cm$^2$).

Test Example 1: Measurement of Solution Characteristics of Conjugated Polymer

The UV-vis absorption spectra of the conjugated polymer were measured using a UV-vis spectrophotometer (PerkinElmer model lambda 35) in order to investigate the solution state (degree of aggregation) depending on temperature.

Figure 2:
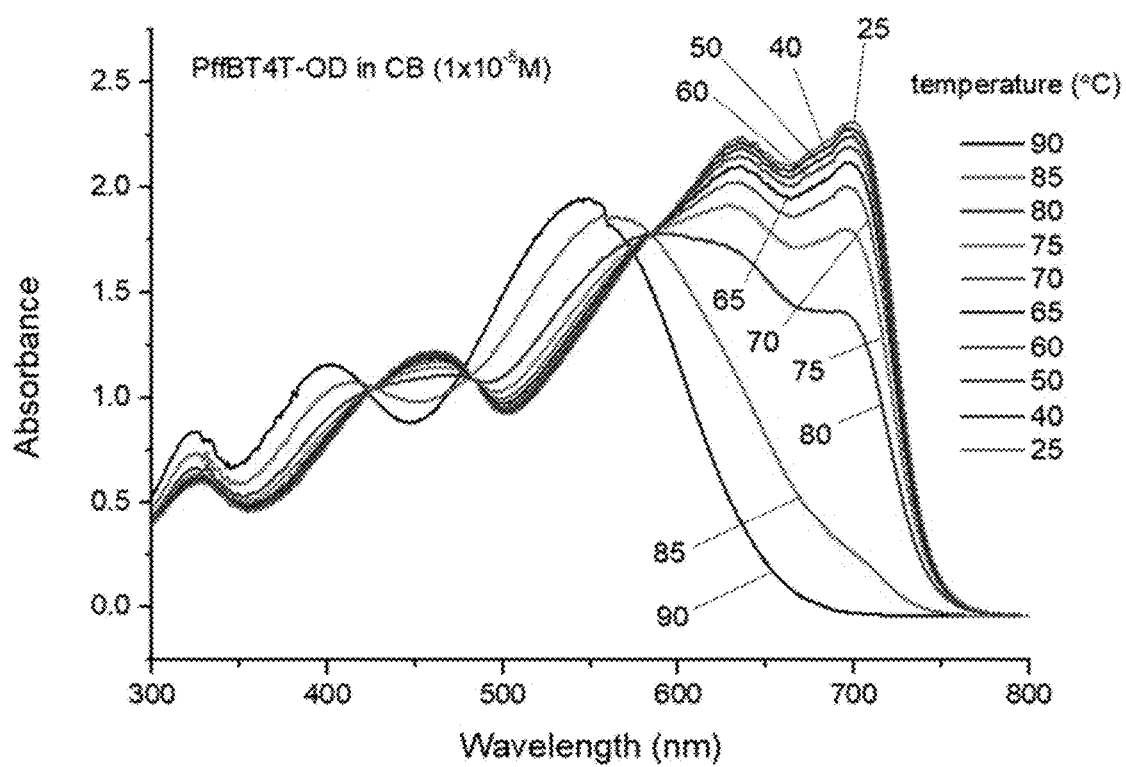
FIG. 2 shows the UV-vis absorption spectra of a conjugated polymer prepared in Comparative Preparation Example 1 measured in chlorobenzene (CB) at different temperatures.

FIG. 1 shows the UV-vis absorption spectra of the conjugated polymer prepared in Preparation Example 1 measured in chlorobenzene (CB) at different temperatures, and FIG. 2 shows the UV-vis absorption spectra of the conjugated polymer prepared in Comparative Preparation Example 1 measured in chlorobenzene (CB) at different temperatures.

As seen from FIGS. 1 and 2, the change in solution state was not observed for the conjugated polymer of Preparation Example 1 despite the change in temperature. This suggests that aggregation did not occur at low temperature or at high temperature. It means that a photoactive layer having superior performance and morphology can be prepared through a room-temperature process after mixing the conjugated polymer of the present disclosure with a fullerene derivative.

In contrast, the conjugated polymer of Comparative Preparation Example 1 showed significant change in solution state depending on temperature change. Especially, the degree of aggregation was severe when the temperature was 80° C. or lower. For the existing conjugated polymer, the aggregation does not occur only when the processing temperature is maintained high. At low temperatures below 80° C., coating is impossible due to excessive aggregation of the solution. And, even if it is possible, a photoactive layer having nonuniform morphology and performance is prepared.

Test Example 2: Morphology of Photoactive Layer

Figure 3:
FIG. 3 shows an image of a PffBT4T-OD:PC71BM photoactive layer (large area: 5.4 cm$^2$) prepared by bar coating in Comparative Example 2.
Figure 4:
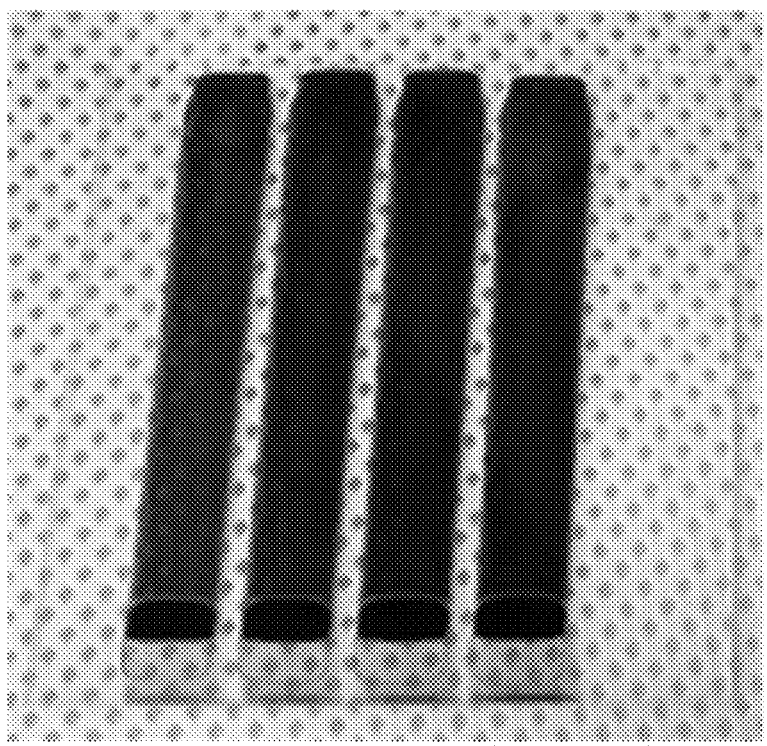
FIG. 4 an image of a BDT-Th10:PC71BM photoactive layer (large area: 5.4 cm$^2$) prepared by bar coating in in Example 7.

FIG. 3 shows an image of the PffBT4T-OD:PC71BM photoactive layer (large area: 5.4 cm$^2$) prepared by bar coating in Comparative Example 2, and FIG. 4 an image of a BDT-Th10:PC71BM photoactive layer (large area: 5.4 cm$^2$) prepared by bar coating in in Example 7.

As seen from FIG. 3 and FIG. 4, the photoactive layer prepared in Comparative Example 2 was coated nonuniformly when it was coated at room temperature. In addition, aggregation of the conjugated polymer occurred significantly in the photoactive layer.

It was confirmed that the photoactive layer prepared in Example 7 was coated very uniformly with reproducibility. In particular, it was confirmed that the coating was uniform from beginning to end with no aggregation of the polymer. Accordingly, it can be seen that a large-area organic solar cell photoactive layer can be fabricated at room temperature uniformly with reproducibility.

Test Example 3: Efficiency of Organic Solar Cell

The performance of the OPV solar cells was measured with the Keithley 2400 digital source meter controlled by a computer under illumination of simulated AM 1.5 G solar light from the AM 1.5 solar simulator (Yamashita Denso, YSS-50A, with a single xenon lamp). The AM 1.5 G light source (100 mW/cm$^2$) was controlled using the PVM 1105 2×2 Si KG5 Window T-TC reference Si photodiode.

Current density depending on voltage was measured for the organic solar cells fabricated in Examples 10-15 and Comparative Examples 1-2 and the result is summarized in Table 1.

TABLE 1

| | Optical open-circuit voltage ($V_{oc}$, V) | Optical short-circuit current ($J_{sc}$, mA/cm$^2$) | Fill factor (FF, %) | Energy conversion efficiency (PCE, %) |
|---|---|---|---|---|
| Example 10 | 0.753 | 18.738 | 68.394 | 9.652 |
| Example 11 | 0.782 | 16.560 | 67.82 | 8.868 |
| Example 12 | 0.776 | 15.147 | 65.211 | 7.666 |
| Example 13 | 2.90 | 4.08 | 67.66 | 8.03 |
| Example 14 | 3.08 | 3.53 | 64.74 | 7.06 |
| Example 15 | 3.05 | 2.37 | 60.90 | 4.96 |
| Comparative Example 1 | 0.735 | 14.65 | 68.41 | 7.36 |
| Comparative Example 2 | 2.743 | 3.61 | 56.9 | 5.64 |

As shown in Table 1, the performance of the organic solar cells (devices) fabricated using the fullerene derivative PC71BM (Examples 10-15 and Comparative Examples 1-2) was compared.

First, the small-area (0.12 cm$^2$) organic solar cells fabricated by spin coating (Examples 10, 11 and 12 and Comparative Example 1) were compared. As a result, it was confirmed that the organic solar cells of Examples 10-12 showed superior optical short-circuit current, fill factor and energy conversion efficiency as compared to Comparative Example 1. Especially, the organic solar cells of Examples 10, 11 and 12 showed about 1-3% higher energy conversion efficiency than Comparative Example 1.

Also, the performance of the large-area (5.4 cm$^2$) organic solar cells fabricated by bar coating (Examples 13, 14 and 15 and Comparative Example 2) were compared. It was found out that the performance of the large-area organic solar cells was worse as a whole. Nevertheless, the decrease in the efficiency of the organic solar cells fabricated using the BDT-Th10 and BDT-Th20 conjugated polymers according to the present disclosure (Examples 13 and 14) was less than about 1.5% even though they were fabricated to have a large area.

In contrast, the organic solar cell of Example 15 using the BDT-Th30 conjugated polymer showed 1.5 times or more decrease in performance as compared to Example 13 when fabricated to have a large area.

The organic solar cell of Comparative Example 2 showed significant decrease in energy conversion efficiency and fill factor by 5.64% and 56.9%, respectively. Through this, it was confirmed that the PffBT4T-OD conjugated polymer, which is widely used in organic solar cells at present, shows efficiency and performance below the averages under a room-temperature (10-50° C.) or low-temperature condition. In conclusion, its effectiveness is very low when applied to a practical process.

In contrast, it was confirmed that the novel conjugated polymer according to the present disclosure exhibits remarkably high efficiency of 9% or higher when applied to a small-area device in a room-temperature process, and can achieve an efficiency up to 8% with high reproducibility even when applied to a large-area device at room temperature. This means that the problem of the existing conjugated polymer in a large-scale production process is solved remarkably.

To sum up, in order to overcome the problems of high crystallinity and low solubility of the existing conjugated polymer used in Comparative Preparation Example 5 and Comparative Preparation Example 6 and decreased uniformity and reproducibility in a room-temperature process caused thereby, the repeating unit including alkyl groups were arranged randomly so as to ensure high solubility and improved uniformity in a room-temperature process.

In other words, the conjugated polymers according to the present disclosure were synthesized by randomly arranging the repeating units including alkyl groups and varying the portion of the units, and the degree of aggregation in solution state was compared. As a result, among the conjugated polymers synthesized in Synthesis Examples 1-3, BDT-Th10 showed the best optimized degree of aggregation in solution state. In addition, when applied to a device, the photoactive layer containing BDT-Th10 showed higher current density and fill factor.

And, for small-area organic solar cell devices fabricated by mixing with PC71BM, the conjugated polymer according to the present disclosure showed improved photoelectric conversion efficiency than the existing conjugated polymer (PffBT4T-OD). In addition, relatively higher efficiency was maintained for large-area (5.4 cm$^2$) devices, too.

Furthermore, it was confirmed that high-efficiency organic solar cells could be fabricated in a reproducible manner. They were confirmed to exhibit superior reproducibility, high uniformity and superior efficiency even when applied to small-area and large-area processes at room temperature.

What is claimed is:

1. A conjugated polymer that is an electron donor, that is soluble without aggregation, that is solution-coatable and is dryable at a temperature below 70° C., and that has an energy conversion efficiency of 7% or more over an area of 5 cm² or more, the conjugated polymer comprising:

a repeating unit represented by Chemical Formula 1A below:

Chemical Formula 1A

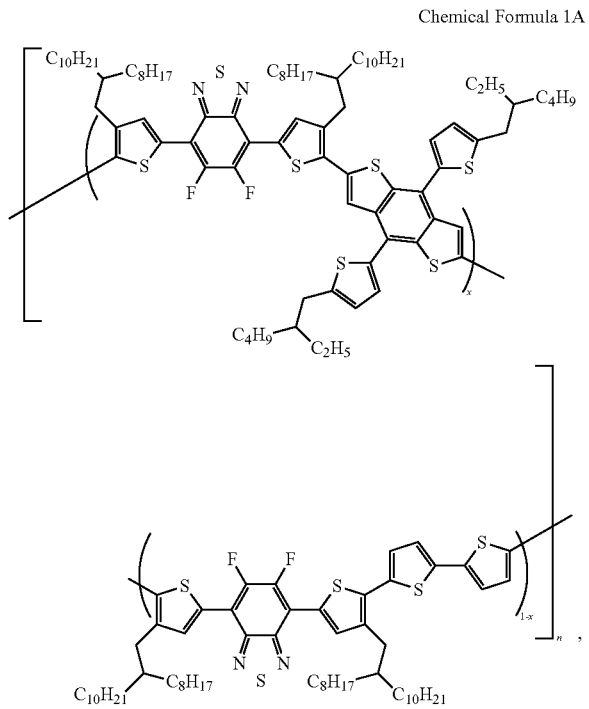

where x is a real number from 0.1 to 0.2; and n is an integer from 1 to 1,000.

2. A coating composition for a photoactive layer for an organic solar cell that can be solution-coated and subsequently dried at a temperature below 70° C. to provide the photoactive layer, the coating composition comprising:
a solvent; and
the conjugated polymer according to claim 1 dissolved in the solvent.

3. The coating composition according to claim 2, wherein the solvent is selected from the group consisting of chlorobenzene, chloroform, p-xylene, 1,2-dichlorobenzene, trichlorobenzene, toluene, 1,8-diiodooctane, and mixtures thereof.

4. The coating composition according to claim 2, wherein the solvent is a mixture of chlorobenzene and 1,2-dichlorobenzene at a volume ratio ranging from 1:0.5 to 1:2 or a mixture of chlorobenzene, 1,2-dichlorobenzene and 1,8-diiodooctane at a volume ratio ranging 1:0.5-2:0.001-0.03.

5. The coating composition according to claim 2, further comprising a fullerene derivative that is an electron acceptor and that is selected from the group consisting of $C_{60}$, $C_{70}$, $C_{84}$, PC71BM, PC61BM, ICBA, ICMA, and combinations thereof.

6. The coating composition according to claim 5, wherein the conjugated polymer and the fullerene derivative are mixed at a weight ratio ranging from 1:1 to 1:2.

7. The coating composition according to claim 2, wherein the coating composition can be dried at a temperature ranging from 10 to 50° C. to provide the photoactive layer.

8. An organic solar cell including a photoactive layer that has an energy conversion efficiency of 7% or more over an area of 5 cm² or more and that comprises the conjugated polymer according to claim 1.

9. The organic solar cell according to claim 8, wherein the photoactive layer further comprises a fullerene derivative that is an electron acceptor and that is selected from the group consisting of $C_{60}$, $C_{70}$, $C_{84}$, PC71BM, PC61BM, ICBA, ICMA, and combinations thereof.

10. The organic solar cell according to claim 9, wherein the conjugated polymer and the fullerene derivative are present in a weight ratio ranging from 1:1 to 1:2.

* * * * *